(12) United States Patent
Duval et al.

(10) Patent No.: US 6,717,143 B2
(45) Date of Patent: Apr. 6, 2004

(54) BEAM ALIGNMENT IN A LOWER COLUMN OF A SCANNING ELECTRON MICROSCOPE OR THE LIKE

(75) Inventors: Paul J. Duval, Lexington, MA (US); Anastasia Y. Tyurina, Needham, MA (US); Neal T. Sullivan, Lunenburg, MA (US)

(73) Assignee: Schlumberger Technologies Inc., San Jose, CA (US)

( * ) Notice: Subject to any disclaimer, the term of this patent is extended or adjusted under 35 U.S.C. 154(b) by 0 days.

(21) Appl. No.: 10/136,692

(22) Filed: Apr. 30, 2002

(65) Prior Publication Data

US 2003/0201392 A1 Oct. 30, 2003

(51) Int. Cl.⁷ .................................................. G21K 7/00
(52) U.S. Cl. ....................................................... 250/310
(58) Field of Search ................................. 250/311, 398, 250/310

(56) References Cited

U.S. PATENT DOCUMENTS 2,802,111 A    8/1957    Reisner
5,258,617 A  * 11/1993  Kaneyama et al. ......... 250/311
5,747,814 A    5/1998   Gordon et al.

FOREIGN PATENT DOCUMENTS

EP          1 263 018 A2    5/2002

\* cited by examiner

Primary Examiner—John R. Lee
Assistant Examiner—Phillip Johnston
(74) Attorney, Agent, or Firm—Cohen, Pontani, Lieberman & Pavane

(57) ABSTRACT

An apparatus for imaging the surface of a sample, such as a scanning electron microscope. The apparatus generates a beam of charged particles directed at the surface, and includes an objective lens and an electrostatic lens for controlling the particle beam. The objective lens and the electrostatic lens constitute a compound lens that has an axis. The beam is controlled so that it travels along the axis of the compound lens in order to avoid adverse consequences induced by, for example, mechanical misalignments and as manifested when the focus of one of the objective and electrostatic lenses is changed during operation of the apparatus.

27 Claims, 2 Drawing Sheets

BEAM ALIGNMENT IN A LOWER COLUMN OF A SCANNING ELECTRON MICROSCOPE OR THE LIKE

FIELD OF THE INVENTION

The present invention is directed to providing improved resolution for a surface imaging technique which uses a beam of charged particles and, in particular, for controlling the electron beam of a scanning electron microscope ("SEM") to improve beam alignment in the lower column.

BACKGROUND OF THE INVENTION

Various instruments are known which rely on emission of charged particles from a sample to derive characteristics of the sample. Examples of such instruments are electron microscopes (e.g., SEMs), focused ion beam microscopes, and mass spectrometers which utilize various well known means to analyze charged particles emitted from the sample.

For facilitating the description of the present invention, it will be explained in connection with an SEM. However, it should be understood that the invention is not limited to an SEM and can be applied by one with ordinary skill in the art to other instruments that steer a beam of charged particles through more than one lens, such as a magnetic lens and an electrostatic lens.

An SEM operates by generating a primary, or incident, electron beam that impacts a sample, a surface of which is being imaged. As a result, backscattered and secondary electrons are emitted from the sample surface and have respective trajectories backward along the original beam direction and at angles diverging therefrom. Emitted electrons are collected by a detector, which is arranged above the sample. The detector generates a signal from the electron emission collected from the sample surface as it is exposed to the electron beam. The signal from the detector is typically processed to create an image of the surface, which is then displayed on a video screen.

An SEM has its main components set up in a part of the apparatus commonly referred to as a column. The column, as the name implies, is usually a vertical arrangement starting at the top with an electron source, or gun, and ending at the bottom with the sample. Positioned between the gun and sample are various well known components that constitute the upper, middle and lower portions of the column and which are used to, for example, correct the shape of the beam, align the beam, and provide scanning by deflecting the beam along an x-direction and a y-direction (see FIG. 3) in a plane perpendicular to the incident beam. SEMs can contain more than one of any of such components, as well as other components that are not discussed herein. Also, it should be understood that the position of the various components need not be as shown in the drawings and/or as described herein, such position being presented for illustrative purposes rather than accuracy.

FIG. 1 shows electron beam 1 passing through a conventional lower column 3 shown in cross section. A typical lower column includes beam deflector 5, scan deflector 7, and electromagnetic lens 11. Deflector 5 is used for aligning the beam within the column. Scan deflector 7 causes beam 1 to controllably depart from its path for a minute range of scanning motion along the x-direction and y-direction (the scanning limit in the x-direction is shown in broken lines, with the deflection angles to points 23 and 25 being exaggerated) in order to scan the surface of sample 9.

Electromagnetic lens 11 is provided for focusing beam 1 to a very small spot on sample 9 to enable high resolution imaging. Such a lens is commonly called an objective lens or a final lens. Its physics and its operation are well known. In the illustrative representation of objective lens 11 in FIG. 1, it includes a toroidal, channel-shaped magnetic polepiece 13 with a lens inner pole 15 and a lens outer pole 17, and a winding 19 inside the channel.

It is well known that a beam directed along the axis of a cylindrically symmetric lens will remain on the axis, i.e., it will not be deflected, as the focus of the lens is changed. If a thin lens model of such a lens were to be applied to simplify the physics involved, and thus facilitate understanding of the invention, even if the beam is not directed along the lens axis but it passes through the lens center it will not be deflected as the focus of the lens is changed. However, there is a degradation of resolution for the case where the beam is not traveling along the optical axis. Similarly, for any optical system, there is a trajectory along which a beam is minimally deflected due to changes in focus. This trajectory, or system axis, will generally not be a simple straight line starting from the electron source and ending perpendicular to the target. The trajectory will have several elements. Although each individual lens might have a well defined axis, these will generally not fall on a single straight line. For charged particle optics systems where the final lens is a compound lens (i.e. comprised of electrostatic and electromagnetic elements) the two lenses have centers that are not generally coincident but, under optimal physical construction, it is possible for the two axes to fall on exactly the same line. In this case it is best to align the beam to this common axis. More generally, as a result of unavoidable imperfections in manufacture and mechanical placement of elements, the two lenses will not have a common optical axis. In this case the optimal alignment (to achieve minimal deflection due to changes in focus) occurs when the beam is directed along the line formed by the two lens centers. When such an alignment is achieved, the image will not shift when the focus of either lens is changed—a critical condition to achieve success with an automated metrology system. Additionally, aligning to the axis of the electrostatic lens is optimal to faithfully reproduce the sample characteristics in an image (especially for achieving image symmetry) while concurrently aligning to the axis of the magnetic lens is optimal for resolution.

Objective lens 11 has an axis identified on the drawing with the unit vector 29 in association with center E. It is necessary to align the path of beam 1 to travel substantially along axis 29 in order to achieve satisfactory performance of the SEM. For example, although it is necessary to vary the focus of objective lens 11 during normal operation of the SEM, unless beam 1 travels essentially along axis 29, such variations in focus induce adverse effects with respect to resolution, distortion, magnification and/or motion of features in the derived image of the sample surface. Thus, deflector 5 is used to align beam 1 with axis 29. Beam 1 remains within the confines of axis 29 even during scanning because the range of motion created by scan deflector 7 is too small and because the alignment of beam 1 with deflector 5 is accomplished by taking into account the scanning motion provided by the scan deflector.

Sample 9 is maintained by voltage source 33 at a predetermined voltage relative to polepiece 13. For example, polepiece 13 can be grounded. The biased sample 9 and the grounded magnetic poles of objective lens 11 form an electrostatic "lens". The primary function of this electrostatic lens is to provide a deceleration field for controlling the landing energy of the particles in the beam as they impact on the sample surface. The deceleration field is controlled by adjusting the voltage of source 33. The combination of this electrostatic lens with the above described objective lens constitutes the effective final (compound) lens.

The electrostatic lens has an axis identified on the drawing with the unit vector 31 in association with the center F. Due to the inevitable mechanical misalignments, the electromagnetic axis 29 and the electrostatic axis 31 are typically not coincident nor are they necessarily on a line perpendicular to the sample surface. (The spacing between centers E, F and the difference in orientation between axes 29, 31 are exaggerated for illustrative purposes.) Consequently, merely directing the beam perpendicularly to the sample surface is not necessarily the optimum choice. Thus, if beam 1 travels along axis 29 of objective lens 11, but not along the axis 31 of the electrostatic lens, this misalignment results in an asymmetry in the derived image of the sample surface. The existence of this asymmetry distorts the derived image of the sample, which in turn results in significant errors in any quantitative interpretation of the image (e.g. metrology), thereby significantly and adversely impacting system matching. Further, as was the case with the objective lens, if the electrostatic lens undergoes variations in focus, this will degrade the resolution and cause the other adverse effects mentioned above, such as undesirably changing the magnification. Likewise, if beam 1 travels along axis 31 of the electrostatic lens (but not 29), and the objective lens 11 undergoes variations in focus, this will also have the above-described adverse consequences and will also impair automated attempts at image interpretation.

The magnetic and electrostatic lenses form, in effect, a compound lens with its own axis, which does not necessarily coincide with either one of axes 29 and 31. While it is a relatively simple matter to deflect the beam to the axis of either the objective lens or the electrostatic lens independently, unless the axes of these lenses are coincident, there is no similar means to find the axis of the compound lens. Thus, for optimal system performance, given that image optimization adjustments (e.g. focus) are made to the lenses individually, it is necessary that the beam be directed along the axis of the final (compound) lens.

SUMMARY OF THE INVENTION

One object of the present invention is to provide improved operation of a surface imaging apparatus which uses a beam of charged particles.

Another object of the present invention is to provide improved resolution for a surface imaging apparatus which uses a beam of charged particles.

Yet another object of the present invention is to control the electron beam of an SEM, which has a plurality of lenses in the lower column, to avoid adverse impacts induced by changing the focus of one of these lenses.

A further object of the present invention is to control the path of the incident beam of an SEM so that it travels along the axis of a compound lens formed by the objective lens and the electrostatic lens.

These and other objects are attained by one aspect of the present invention directed to a method for imaging a surface of a sample with an apparatus which directs a beam of charged particles at the surface and includes an objective lens and an electrostatic lens for controlling the particle beam to minimize at least one adverse effect induced by changes in operating parameters of the apparatus, the objective and electrostatic lenses forming a compound lens having an axis. The beam is deflected with at least one deflector toward a second deflector, and the beam is deflected with the second deflector toward the sample surface. An optimum location is determined within the second deflector from which the beam can be deflected by the second deflector to substantially travel along the axis of the compound lens. The at least one deflector is set to align the beam with the optimum location, and the second deflector is set to align the beam with the axis of the compound lens.

Another aspect of the invention is directed to an apparatus for imaging a surface of a sample with a beam of charged particles directed at the sample surface and having an objective lens and an electrostatic lens for controlling the particle beam to minimize at least one adverse effect induced by changes in operating parameters of the apparatus, the objective and electrostatic lenses forming a compound lens. A means is provide for generating the beam of charged particles directed at the sample surface. Another means deflects the generated beam with at least one deflector toward a second deflector. Another means deflects the beam with the second deflector toward the sample surface, and another means determines an optimum location within the second deflector from which the beam can be deflected by the second deflector to substantially travel along the axis of the compound lens. Another means sets the at least one deflector to align the beam with the optimum location, and another means sets the second deflector to align the beam with the axis of the compound lens.

Yet another aspect of the present invention is directed to an apparatus for controlling a beam of charged particles used in a machine that images a surface of a sample by directing the particle beam at the surface sample, and which includes an objective lens and an electrostatic lens forming a compound lens, the particle beam being controlled to minimize at least one adverse effect induced by changes in machine operating parameters. A means is provided for deflecting the beam with at least one deflector toward a second deflector. Another means deflects the beam with the second deflector toward the sample surface, and another means determines an optimum location within the second deflector from which the beam can be deflected by the second deflector to substantially travel along the axis of the compound lens. Another means sets the at least one deflector to align the beam with said axis, and another means sets the second deflector to align the beam with the axis of the compound lens.

DETAILED DESCRIPTION OF THE DRAWINGS

Figure 1:
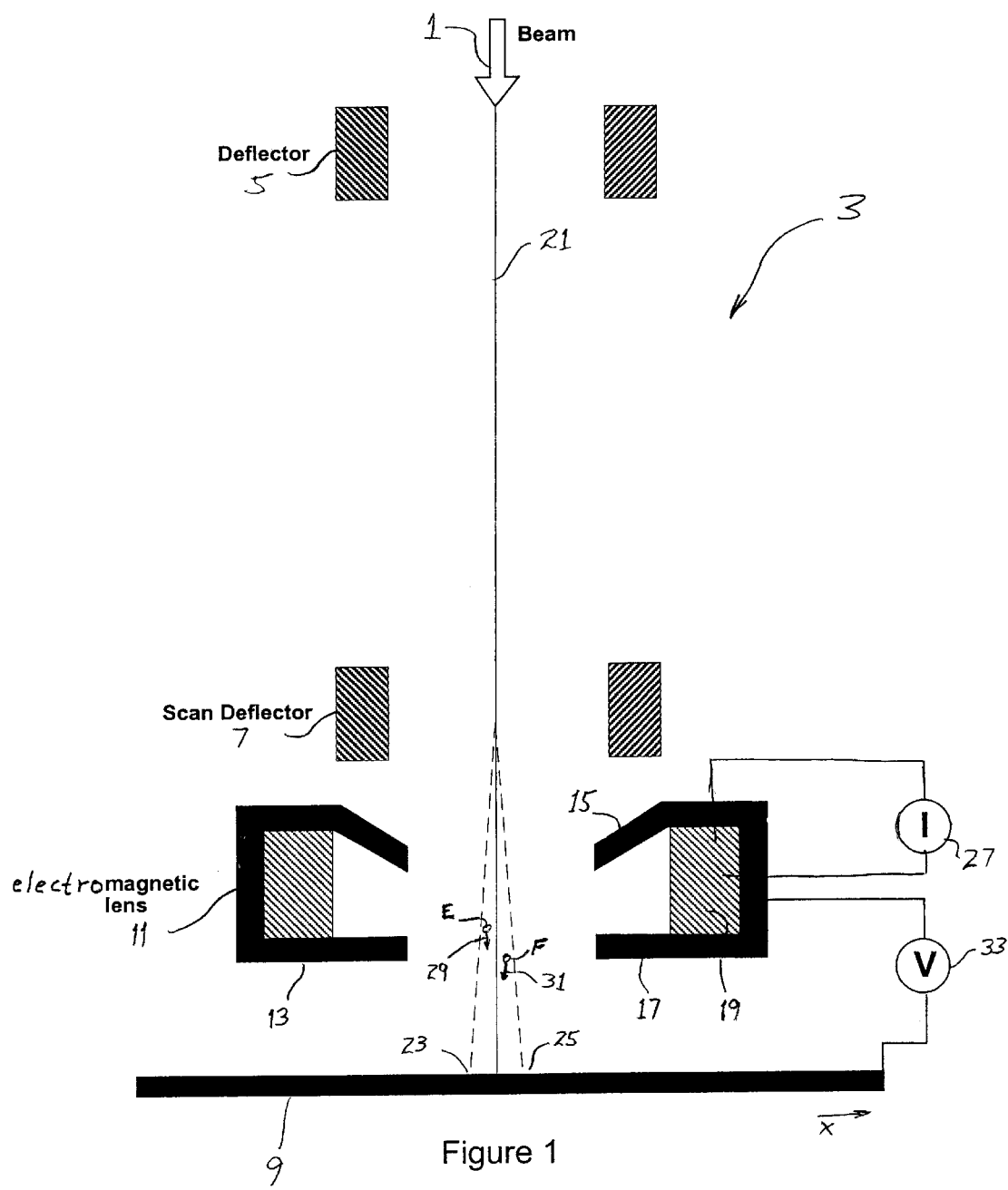
FIG. 1 is a schematic cross-section of a conventional lower column of an SEM.
Figures 2, 3:
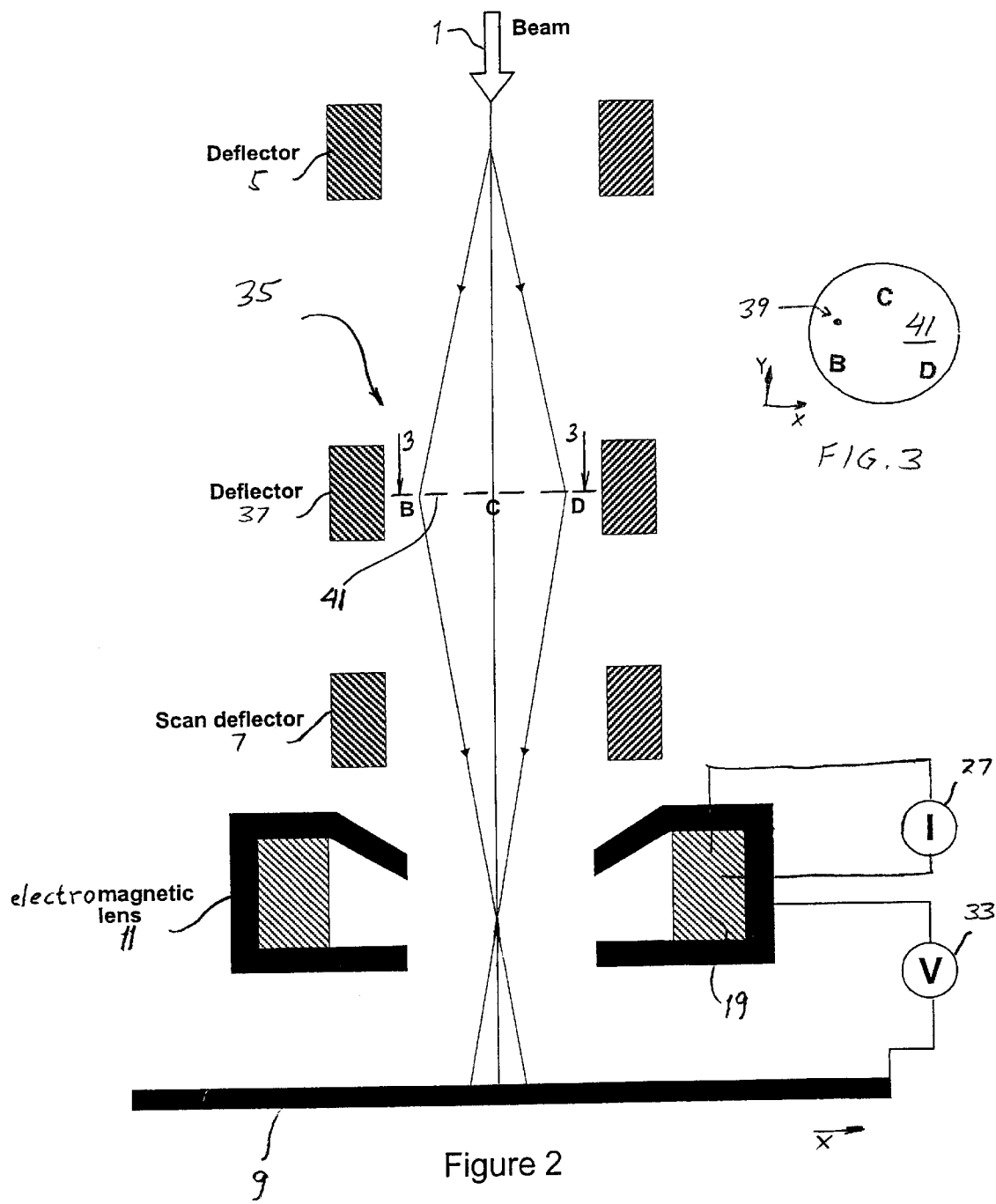
FIG. 2 is a schematic cross-section of the lower column of an SEM arranged in accordance with the present invention.
FIG. 3 is a cross-sectional view taken along line 3—3 in FIG. 2.

FIG. 2 shows a lower column 35 arranged in accordance with the present invention. The upper and middle portions of the column are not shown because they do not pertain to a description of the invention. Lower column 35 can be identical to lower column 3, but with the addition of deflector 37. Although in the preferred embodiment deflector 37 is an electrostatic deflector, it can also be a magnetic deflector. Of course, it is understood that associated with deflector 37 are the usual electrical components required to perform a beam deflection function, the details of which are well known and, therefore, need not be described herein.

In accordance with the present invention, deflector 37 is utilized to deflect beam 1 along the axis of the compound lens. However, deflector 37 can only do so from an optimum location 39 within its confines and which is substantially in deflection plane 41, as shown in FIGS. 2 and 3. The present invention is designed to determine an optimum setting for deflector 5 so that when deflector 37 is set to align beam 1 to either element of the compound lens the effect is to align beam 1 with the compound lens as well. The specific steps involved are as follows.

1. Set the scanning parameters for scan deflector 7 with respect to timing and calibration.

2. Set the distance from the objective lens 11 to sample 9 (known as the working distance) and vary the voltage of source 33 so that the electrostatic lens is adjusted to the desired landing energy.

3. Set the focus of objective lens 11 on sample 9 by varying the current with current source 27. Store the magnetic lens current, when the sample is in focus, as the magnetic lens focus setting.

4. Use deflector 5 to deflect beam 1 to location B on plane 41.

5. Wobble objective lens 11, by varying the output current of source 27 to winding 19 about the magnetic lens focus setting, while adjusting deflector 37 until a setting for deflector 37 is found at which motion of a surface feature on the surface of sample 9 in the displayed SEM image is minimized despite the ongoing wobbling. The fact that such motion is minimized indicates that beam 1 is traveling along axis 29 of the objective lens. This determination is made manually by an operator watching the screen while adjusting deflector 37. Despite reliance on manual observation, a high degree of accuracy can be attained due to the very high magnifications afforded by the SEM which make it possible to notice even minute motion due to the wobbling. This operation could also be performed automatically. An apparatus to enable the wobbling of objective lens 11 is disclosed in copending U.S. Ser. No. 09/734,409.

6. Store the setting for deflector 37 found in step 5 that minimizes the motion created by wobbling objective lens 11 while beam 1 is aligned by deflector 5 with location B. The setting for deflector 37 is representative of the deflection required to re-direct the beam along the axis of the objective lens, when deflector 5 initially deflects the beam to location B.

7. Return the objective lens 11 to its focus setting.

8. Wobble the electrostatic lens, by varying the voltage of source 33 about the value stored for the desired landing energy, while adjusting deflector 37 until a setting for deflector 37 is found at which motion of a surface feature on the surface of sample 9 in the displayed SEM image is minimized despite the ongoing wobbling. This determination is made in the same way as described above in step 5. The fact that such motion is minimized indicates that beam 1 is traveling along axis 31 of the electrostatic lens.

9. Store the setting (representative of x, y coordinates, as explained above) for deflector 37 found in step 5 that minimizes image motion created by wobbling electrostatic lens 11 while beam 1 is aligned by deflector 5 with location B.

10. Compute and store the difference value between the settings stored in steps 6 and 9. This difference value for location B can be expressed as $\Delta x$ and $\Delta y$ results.

11. Repeat steps 4 to 10 for deflector 5 aligning the beam with location C on plane 41 to obtain a second difference value.

12. Repeat steps 4 to 10 for deflector 5 aligning the beam with location D on plane 41 to obtain a third difference value.

13. Compute from the three difference values computed in steps 4 to 12 the optimum location 39 on plane 41 from which beam 1 can be deflected to yield a minimum difference value. Further details on this step are provided below.

14. Set deflector 5 to align beam 1 with the optimum location 39 determined in step 13.

15. Set deflector 37 by adjusting it while wobbling objective lens 11 until a setting is found at which motion of a surface feature on the surface of sample 9 in the displayed SEM image is minimized despite the ongoing wobbling. The fact that such motion is minimized indicates that beam 1 is traveling along the axis of the compound lens, to the extent possible. This determination is made in the same way as described above in step 5.

Locations B, C, D are selected to be positioned within the confines of deflector 37, substantially on plane 41, and separated as much as possible from each other. Also, these three locations cannot be on a line.

The following description explains above-listed step 13 as to how the optimum location 39 on plane 41 is determined from the three above-described difference values obtained for locations B, C and D. One approach is to consider the optimum location 39 to be at the intersection of three planes Px, Py and Pz, where:

$P_x$ is a plane passing through the three points of $(x_1,y_1,\Delta x_1)$, $(x_2,y_2,\Delta x_1)$ and $(x_3,y_3,\Delta x_3)$. Point $(x_1,y_1,\Delta x_1)$ corresponds to location B, with its coordinates being $(x_1,y_1)$, and $\Delta x_1$ represents the x component of the difference value obtained in step 10, above, for location B. Similarly, the other points correspond to the x,y coordinates, respectively, of locations C and D and the x component of the difference values found in steps 11 and 12;

$P_y$ is a plane passing through the three points of $(x_1,y_1,\Delta y_1)$, $(x_2,y_2,\Delta y_1)$ and $(x_3,y_3,\Delta y_3)$. Point $(x_1,y_1,\Delta y_1)$ corresponds to location B, with its coordinates being $(x_1,y_1)$, and $\Delta y_1$ represents the y component of the difference value obtained in step 10, above, for location B. Similarly, the other points correspond to the x,y coordinates, respectively, of locations C and D and the y component of the difference values found in steps 11 and 12; and $P_z$ is the x,y plane, with z=0.

To find the optimum location, first the intersection of planes $P_x$ and $P_z$ is found. This yields a line, $L_x$.

Then, the intersection of planes $P_y$ and $P_z$ is found. This yields a line, $L_y$.

Finally, the intersection of lines $L_x$ and $L_y$ is found, and this intersection is the optimum location.

It is submitted that the mathematics for making the above-described computations for defining lines $L_x$ and $L_y$ and the optimum location at their intersection is well known. However, it will be summarized below for the convenience of the reader.

In order to derive equations for the lines $L_x$ and $L_y$, it will be recalled that a generic equation for a plane is $$A*x+B*y+C*z+D=0,$$

where (A,B,C) is a vector normal to the plane. Thus, the expressions for planes $P_x$ and $P_y$ are as follows.

$$P_x: A_x*x+B_x*y+C_x*z+D_x=0$$

$$P_y: A_y*x+B_y*y+C_y*z+D_y=0$$

A vector can be defined as a vector product of two vectors. The resultant vector is normal to both vectors. Thus, vector (A,B,C) for defining plane $P_x$ can be determined by multiplying two vectors in plane $P_x$, as follows.

$$(A, B, C) = (x_1 - x_2, y_1 - y_2, \Delta x_1 - \Delta x_2) *$$

$$(x_3 - x_2, y_3 - y_2, \Delta x_3 - \Delta x_1) = \begin{vmatrix} i & j & k \\ x_1 - x_2 & y_1 - y_2 & \Delta x_1 - \Delta x_2 \\ x_3 - x_2 & y_3 - y_2 & \Delta x_3 - \Delta x_2 \end{vmatrix} =$$

$$i * \{(y_1 - y_2)(\Delta x_3 - \Delta x_2) - (y_3 - y_2)(\Delta x_1 - \Delta x_2)\} +$$
$$j * \{(x_3 - x_2)(\Delta x_1 - \Delta x_2) - (x_1 - x_2)(\Delta x_3 - \Delta x_2)\} +$$
$$k * \{(x_1 - x_2)(y_3 - y_2) - (x_3 - x_2)(y_3 - y_2)\},$$

where i,j,k are basis vectors. Thus, $$A_x = (y_1 - y_2)(\Delta x_3 - \Delta x_2) - (y_3 - y_2)(\Delta x_1 - \Delta x_2),$$

$$B_x = (x_3 - x_2)(\Delta x_1 - \Delta x_2) - (x_1 - x_2)(\Delta x_3 - \Delta x_2), \text{ and}$$

$$C_x = (x_1 - x_2)(y_3 - y_2) - (x_3 - x_2)(y_3 - y_2).$$

$D_x$ is determined by the following:

$$D_x = A_x x_1 + B_x y_1 + C_x \Delta x_1$$

Symmetrical expressions apply to define plane $P_y$, with $\Delta x_1$ being replaced by $\Delta y_1$.

With the mathematical representations for planes $P_x$ and $P_y$ now being known, the intersection of lines $L_x$ and $L_y$ can be determined as follows. Line $L_x$ is in plane $P_z$ (because it forms the intersection of planes $P_x$ and $P_z$) so that $L_x$ is a set of points of plane $P_x$ with the property of z=0 in the above expression for plane $P_x$.
Therefore, for line $L_x$ $$A_x x + B_x y + D_x = 0$$

Likewise, for line $L_y$ $$A_y x + B_y y + D_y = 0$$

We thus have two equations, with x and y for the optimum location being the two unknowns. These equations can be solved for the x and y values to yield the following expressions:

$$x = \frac{B_y D_x - B_x D_y}{B_y A_x - A_y B_x}$$

$$y = \frac{A_y D_x - A_x D_y}{B_y A_x - A_y B_x}$$

Validation of the effectiveness of a particular alignment can be performed by viewing the derived image of the sample for a zero degree orientation (physical sample orientation with respect to the electron optics) and quantitatively comparing its symmetry with a 180 degree orientation.

Although the detailed description provided above discusses specific embodiments of the present invention, various modifications thereto will be readily apparent to anyone with ordinary skill in the art. For example, the above-described single-deflection scanning can be replaced with dual-deflection scanning. This allows placement of the scanning crossover point along the beam axis so as to place it at the plane of unit angular magnification of the compound lens. Also, to conduct a routine adjustment of the equipment, steps 8 and 9 described above can be repeated every predetermined number of hours based on the periodic maintenance schedule of a particular machine. Furthermore, an iterative process could be applied after step 13 by selecting three locations B', C', D' centered around and closer to the optimum location derived in step 13. Then, steps 4 to 13 would be repeated with locations B', C', D'. Also, the alignment of the beam per step 15 with deflector 37, which has limited capability for perfectly aligning the beam with the axes of both the objective and electrostatic lenses, particularly when they are relatively significantly misaligned, can be revised to align the beam as nearly as possible with both lens axes. This can be accomplished by adding another deflector, similar to deflector 37, in the vicinity of objective lens 11 and/or modifying the mathematics set forth above. Thus, deflector 37 would achieve alignment with one of the axes, and the added deflector would achieve alignment with the other one. All such modifications are intended to fall within the scope of the present invention as defined by the following claims.

We claim:

1. A method for imaging a surface of a sample with an apparatus which directs a beam of charged particles at the surface and includes an objective lens and an electrostatic lens for controlling the particle beam to minimize at least one adverse effect induced by changes in operating parameters of the apparatus, the objective and electrostatic lenses forming a compound lens having an axis, comprising:
   deflecting the beam with at least one deflector toward a second deflector;
   deflecting the beam with the second deflector toward the sample surface;
   determining an optimum location in a plane within the second deflector from which the beam can be deflected by the second deflector to substantially travel along the axis of the compound lens;
   setting the at least one deflector to align the beam with said optimum location; and
   setting the second deflector to align the beam with the axis of the compound lens.

2. The method of claim 1, wherein said plane containing the optimum location is substantially perpendicular to the particle beam.

3. The method of claim 2, wherein the step of determining the optimum location comprises selecting a plurality of locations substantially on said plane, controlling the particle beam from each of the plurality of locations to minimize at least one of the adverse effects to obtain a plurality of respective resultant settings, and computing the optimum location from said plurality of respective settings.

4. The method of claim 3, wherein the step of selecting a plurality of locations comprises selecting at least three locations that are widely separated from each other and are not along one line.

5. The method of claim 3, wherein said at least one adverse effect is induced by focus variations of at least one of the objective and electrostatic lenses, and wherein the step of controlling the particle beam from each of the plurality of locations to minimize at least one of the adverse effects comprises wobbling the objective lens and adjusting the deflection of the particle beam by the second deflector to obtain a resultant deflection at which motion of a feature in a displayed image of the sample surface due to said wobbling is minimized, and the resultant deflection is stored as one of said resultant settings.

6. The method of claim 5, wherein the step of controlling the particle beam from each of the plurality of locations to minimize at least one of the adverse effects further comprises, after the objective lens is returned to its setting prior to the wobbling step, wobbling the electrostatic lens and adjusting the deflection of the particle beam by the second deflector to obtain a resultant deflection at which motion of a feature in a displayed image of the sample surface due to said wobbling is minimized, and the resultant deflection is stored as one of said resultant settings.

7. The method of claim 6, wherein the step of controlling the particle beam from each of the plurality of locations to minimize at least one of the adverse effects further comprises determining a difference value between the resultant deflection for the objective lens and the resultant deflection for the electrostatic lens at each of said plurality of locations which are used for said step of computing the optimum location.

8. The method of claim 1, wherein setting the second deflector to align the beam with the axis of the compound lens comprises wobbling the objective lens and adjusting the deflection of the particle beam by the second deflector until motion of a feature in a displayed image of the sample surface due to said wobbling is minimized.

9. Apparatus for imaging a surface of a sample with a beam of charged particles directed at the sample surface and having an objective lens and an electrostatic lens for controlling the particle beam to minimize at least one adverse effect induced by changes in operating parameters of the apparatus, the objective and electrostatic lenses forming a compound lens having an axis, comprising:
   means for generating the beam of charged particles directed at the sample surface;
   means for deflecting the generated beam with at least one deflector toward a second deflector;
   means for deflecting the beam with the second deflector toward the sample surface;
   means for determining an optimum location in a plane within the second deflector from which the beam can be deflected by the second deflector to substantially travel along the axis of the compound lens;
   means for setting the at least one deflector to align the beam with said optimum location; and
   means for setting the second deflector to align the beam with the axis of the compound lens.

10. The apparatus of claim 9, wherein said plane containing the optimum location is substantially perpendicular to the particle beam.

11. The apparatus of claim 10, wherein the means for determining the optimum location comprises means for controlling the particle beam from each of a plurality of locations substantially on said plane so as to minimize at least one of the adverse effects to obtain a plurality of respective resultant settings, and computing the optimum location from said plurality of respective settings.

12. The apparatus of claim 11, wherein the plurality of locations comprises at least three locations that are widely separated from each other and are not along one line.

13. The apparatus of claim 11, wherein said at least one adverse effect is induced by focus variations of at least one of the objective and electrostatic lenses, and wherein the means for controlling the particle beam from each of the plurality of locations to minimize at least one of the adverse effects comprises means for wobbling the objective lens and adjusting the deflection of the particle beam by the second deflector to obtain a resultant deflection at which motion of a feature in a displayed image of the sample surface due to said wobbling is minimized, and means for storing the resultant deflection as one of said resultant settings.

14. The apparatus of claim 13, wherein the means for controlling the particle beam from each of the plurality of locations to minimize at least one of the adverse effects further comprises means for wobbling the electrostatic lens and adjusting the deflection of the particle beam by the second deflector to obtain a resultant deflection at which motion of a feature in a displayed image of the sample surface due to said wobbling is minimized, and means for storing the resultant deflection as one of said resultant settings.

15. The apparatus of claim 14, wherein the means for controlling the particle beam from each of the plurality of locations to minimize at least one of the adverse effects further comprises means for determining a difference value between the resultant deflection for the objective lens and the resultant deflection for the electrostatic lens at each of said plurality of locations which are used for computing the optimum location.

16. The apparatus of claim 9, wherein said means for setting the second deflector to align the beam with the axis of the compound lens comprises means for wobbling the objective lens and adjusting the deflection of the particle beam by the second deflector until motion of a feature in a displayed image of the sample surface due to said wobbling is minimized.

17. Apparatus for controlling a beam of charged particles used in a machine that images a surface of a sample by directing the particle beam at the surface sample, and which includes an objective lens and an electrostatic lens forming a compound lens having an axis, the particle beam being controlled to minimize at least one adverse effect induced by changes in machine operating parameters, comprising:
   means for deflecting the beam with at least one deflector toward a second deflector;
   means for deflecting the beam with the second deflector toward the sample surface;
   means for determining an optimum location in a plane within the second deflector from which the beam can be deflected by the second deflector to substantially travel along the axis of the compound lens;
   means for setting the at least one deflector to align the beam with said optimum location; and
   means for setting the second deflector to align the beam with the axis of the compound lens.

18. The apparatus of claim 17, wherein said plane containing the optimum location is substantially perpendicular to the particle beam.

19. The apparatus of claim 18, wherein the means for determining the optimum location comprises means for controlling the particle beam from each of a plurality of locations substantially on said plane so as to minimize at least one of the adverse effects to obtain a plurality of respective resultant settings, and computing the optimum location from said plurality of respective settings.

20. The apparatus of claim 19, wherein the plurality of locations comprises at least three locations that are widely separated from each other and are not along one line.

21. The apparatus of claim 19, wherein said at least one adverse effect is induced by focus variations of at least one of the objective and electrostatic lenses, and wherein the means for controlling the particle beam from each of the plurality of locations to minimize at least one of the adverse effects comprises means for wobbling the objective lens and adjusting the deflection of the particle beam by the second deflector to obtain a resultant deflection at which motion of a feature in a displayed image of the sample surface due to said wobbling is minimized, and means for storing the resultant deflection as one of said resultant settings.

22. The apparatus of claim 20, wherein the means for controlling the particle beam from each of the plurality of locations to minimize at least one of the adverse effects further comprises means for wobbling the electrostatic lens and adjusting the deflection of the particle beam by the second deflector to obtain a resultant deflection at which motion of a feature in a displayed image of the sample surface due to said wobbling is minimized, and means for storing the resultant deflection as one of said resultant settings.

23. The apparatus of claim 22, wherein the means for controlling the particle beam from each of the plurality of locations to minimize at least one of the adverse effects further comprises means for determining a difference value between the resultant deflection for the objective lens and the resultant deflection for the electrostatic lens at each of said plurality of locations which are used for computing the optimum location.

24. The apparatus of claim 11, wherein said means for setting the second deflector to align the beam with the axis of the compound lens comprises means for wobbling the objective lens and adjusting the deflection of the particle beam by the second deflector until motion of a feature in a displayed image of the sample surface due to said wobbling is minimized.

25. Apparatus for controlling a beam of charged particles used in a machine that images a surface of a sample by directing the particle beam at the surface sample, and which includes a plurality of lenses forming a compound lens having an axis, the particle beam being controlled to minimize at least one adverse effect induced by changes in machine operating parameters, comprising:

means for deflecting the beam with at least one deflector toward a second deflector;

means for deflecting the beam with the second deflector toward the sample surface;

means for determining an optimum location in a plane within the second deflector from which the beam can be deflected by the second deflector to substantially travel along the axis of the compound lens;

means for setting the at least one deflector to align the beam with said optimum location; and means for setting the second deflector to align the beam with the axis of the compound lens.

26. Apparatus for controlling a beam of charged particles used in a machine that images a surface of a sample by directing the particle beam at the surface sample, and which includes a plurality of lenses forming a compound lens having an axis, the particle beam being controlled to minimize at least one adverse effect induced by changes in machine operating parameters, comprising:

first and second beam deflectors;

means for determining an optimum location in a plane within the second beam deflector from which the beam can be deflected by the second beam deflector to substantially travel along the axis of the compound lens;

means for setting the first beam deflector to align the beam with said optimum location; and means for setting the second beam deflector to direct the beam from the optimum location to the axis of the compound lens.

27. A method for imaging a surface of a sample with an apparatus which directs a beam of charged particles at the surface and includes a plurality of lenses within a column for controlling the particle beam to minimize at least one adverse effect induced by changes in operating parameters of the apparatus, the plurality of lenses forming a compound lens having an axis, comprising:

providing first and second beam deflectors;

determining an optimum location in a plane within the second beam deflector from which the beam can be deflected by the second beam deflector to substantially travel along the axis of the compound lens;

selling the first deflector to align the beam with said optimum location; and setting the second beam deflector to align the beam with the axis of the compound lens.

* * * * *